United States Patent [19]

Yeh

[11] 4,193,079

[45] Mar. 11, 1980

[54] MESFET WITH NON-UNIFORM DOPING

[75] Inventor: Keming W. Yeh, Westchester, Calif.

[73] Assignee: Xerox Corporation, Stamford, Conn.

[21] Appl. No.: 873,331

[22] Filed: Jan. 30, 1978

[51] Int. Cl.² .......................................... H01L 29/78
[52] U.S. Cl. ...................................... 357/22; 357/23; 357/90; 357/91
[58] Field of Search ........................ 357/22, 23, 90, 91

[56] References Cited

U.S. PATENT DOCUMENTS 4,021,835  5/1977  Masuhara ............................. 357/23
4,053,925  10/1977  Burr ..................................... 357/91

Primary Examiner—Edward J. Wojciechowicz
Attorney, Agent, or Firm—Ronald L. Taylor

[57] ABSTRACT

A high frequency FET having a channel region and wherein said channel region contains an implant, said implant having a first dosage concentration at a first distance from the gate of said FET and a second dosage concentration at a second distance from the said gate and wherein said first distance is larger than said second distance and said first dosage concentration is larger than said second dosage concentration.

1 Claim, 4 Drawing Figures

MESFET WITH NON-UNIFORM DOPING

FIELD OF THE INVENTION

This invention relates to MESFET devices.

BACKGROUND OF THE PRIOR ART

MESFETs are characterized by a metal gate in contact with a channel region. This structure introduces a loading capacitance which decreases the frequency response of the device. In the prior art, the use of these devices have been limited as the switching speed has been reduced by the gate loading capacitance.

SUMMARY OF THE INVENTION

This invention employs a non-uniform doped channel within a MESFET. The charge profile of the channel region is represented by a charge gradiant being lowest to the point adjacent the metal gate and rising to a maximum at the point of greatest channel depth furthest from the gate.

The channel may be made of one continuous doped implant material having a volume of maximum charge substantially at a point furthest from the gate and with the charge diminishing to a minimum at a point closest to the gate.

Alternately, the implanted charge may comprise two discreet implants with the lower implant dosage nearest the gate and the higher dosage implant furthest from the gate.

In the foregoing case, the channel is implanted with two separate implants, and one implant may be P material while the other is N material.

A third case exists where a doped implant is provided at a predetermined depth in the channel.

In each case of the non-uniform charged channel region, the frequency response is improved.

Accordingly, it is the object of the invention to provide a MESFET having a non-uniform doped channel.

It is another object of this invention to have a non-uniform doped channel MESFET wherein the frequency response is inversely varied with respect to the spacing of the implant center of charge from the metal gate.

Accordingly, it is another object of this invention to provide a non-uniform doped MESFET wherein the transconductance is proportional to the concentration of the implant.

Accordingly, it is another object of this invention to provide a MESFET with a non-uniform doped implant, thereby increasing the frequency response.

DESCRIPTION OF THE PREFERRED EMBODIMENT

Figure 1:
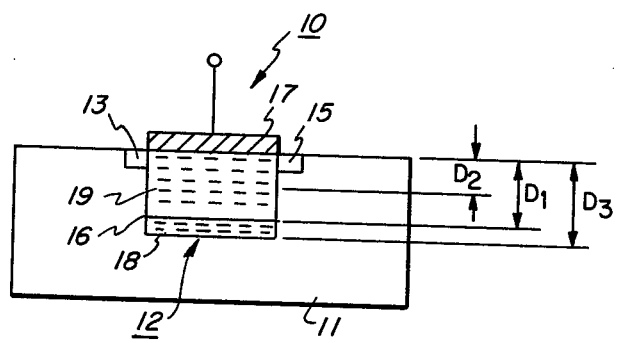
FIG. 1 shows a MESFET with non-uniform doping wherein the channel region contains a continuous implant having a varying charge profile.

Referring now to FIG. 1, the MESFET having a continuous non-uniform implant is shown and generally referred to as 10. A substrate 11 has mounted in it source and drain regions 13 and 15, defining a channel region 12 therebetween. Mounted across one side of the channel region is a metal gate 17.

The channel region 12 contains an implant which is continuous throughout the depth $D_3$ of the implant. The charge concentration of the implant varies continuously from a lower dosage 19 to a higher dosage 16. For the purpose of explanation, the implant volume within the channel region 12 is shown as having centers of charge 19 and 16. The center of charge of the lower dosage volumn is shown as 19 and being a distance $D_2$ from the metal gate 17. The center of charge of the heavier dosage volumn is shown as 16 being a distance $D_1$ from the metal gate 17. The depth of the channel region is shown as $D_3$.

The profile of the charge concentration within the channel along a line extending from the gate 17, through to the boundary 18, furthest from the gate, is represented by a gradiant which increases to a maximum charge toward the boundary 18.

Figure 2:
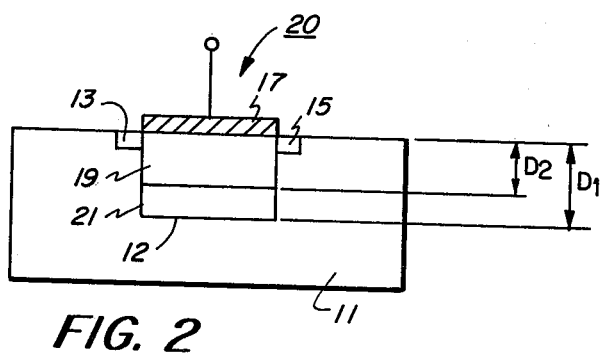
FIG. 2 shows the MESFET of FIG. 1 but with the channel region having two implants, each implant being separate and which may be of different conductivities.

FIG. 2 shows a MESFET generally referred to as 20 with the same numerals representing the same parts operating in the same way and which contains in its channel region 12, two discreet implants 21 and 19. Implant 19 is of a lesser dosage and extends to a depth of $D_2$ from the gate 17. Implant 21 is of a more concentrated dosage and extends from the gate 17 to distance $D_1$.

The implants 19 and 21 may be different conductivity material or may be the same conductivity material, of different and distinct dosages (i.e., N and N+).

Figure 3:
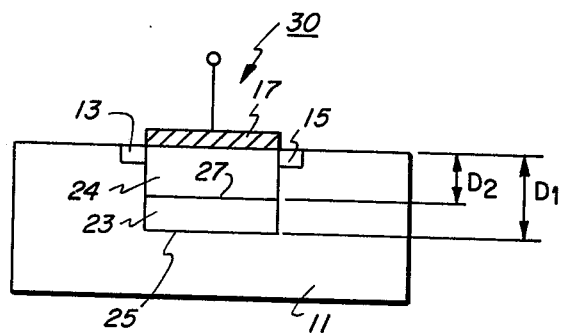
FIG. 3 shows the MESFET of FIG. 1 wherein the implant is located at a predetermined distance from the conductive gate.

FIG. 3 shows a third alternative MESFET with the same numbers indicating the same and similar parts as FIG. 2. In the device of FIG. 3, the implant has a first border 25 at a distance $D_1$ from the gate and a second border 27 at a distance $D_2$ from the gate. The other implant 24 is the material as the substrate 11.

Referring back to FIG. 1, the area 16 having a center of charge at a distance $D_1$ from the gate, may be represented by the dosage concentration N1 and the portion of the implant 19, having a center of charge at a distance $D_2$ from the gate may be represented by a dosage concentration N2.

Similarly, the dosage concentration of the implant 21 at distance $D_1$ from the gate 17 in FIG. 2 may be represented by N1 while N2 may be used to represent the dosage concentration of the implant 19 extending to a distance $D_2$ from the gate 17.

In FIG. 3, the dosage concentration of the implant 23 may be represented by N1.

Non-uniform doping may be characterized as two MESFETs connected in parallel. The bottom MESFET or implant is much more conductive than the top MESFET or implant and dominates the behavior of the device through the operation region, due to the higher dosage concentration of the implant furthest away from the gate.

It has been found that the gate capacitance is diminished or varies inversely proportional to the distance of the center of charge of the implant. Therefore, the rule of thumb of obtaining a larger frequency response and a smaller loading capacitance is to maximize the distance from the gate of the center of charge of the dominant higher dosage. Similarly, it is advantageous to increase the dosage concentration of the implant at the channel region furthest away from the gate without causing mobility degradation. This may be realized by using a $\pi$-type substrate and using a deep As+ implant.

Figure 4:
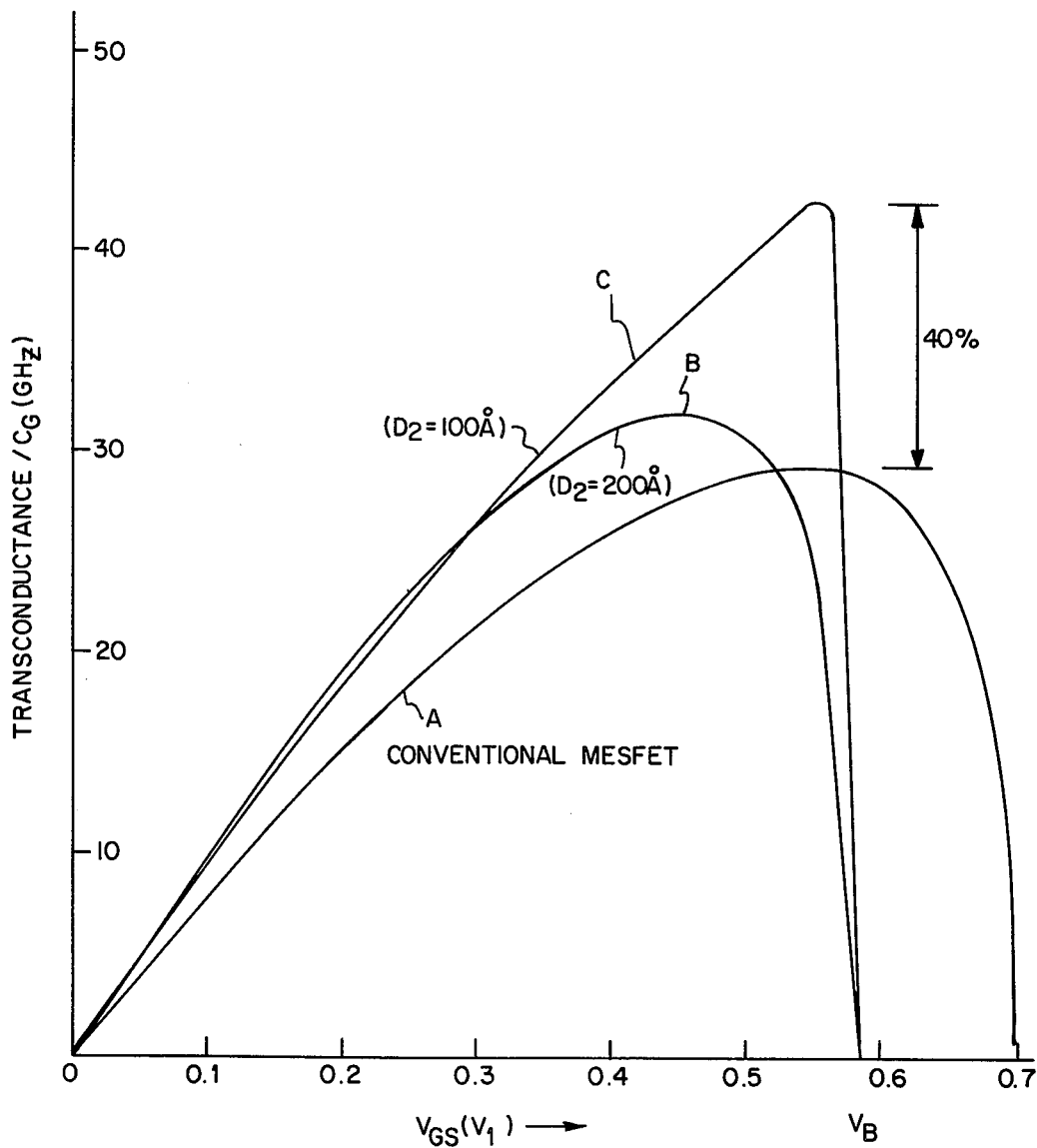
FIG. 4 shows the improved performance characteristics of the device of FIG. 2.

Examples of results achieved using the model of FIG. 2 are shown in FIG. 4. In that case, a MESFET using a channel region with non-uniform doping and wherein two discreet implants are provided within the channel, the implant furthest from the gate having a substantially larger dosage concentration, is shown.

In curve A, the frequency response of the MESFET is shown by the vertical axis and expressed in transconductance per gate capacitance is gigahertz.

The horizontal axis is expressed as the gate to source voltage. Using the conventional MESFET, as the gate to source voltage increases, the frequency response increases to approximately 30 gigahertz and then falls off.

Curve B shows the non-uniform doped channel MESFET using the two implants as shown in FIG. 2 wherein the distance $D_2$ is shown as 200 angstroms. The dosage concentration of Region 21 beig displaced the greater distance of the two implants from the FET metal gate is shown as $10^{15}$ cm$^{-3}$ and the maximum frequency response is increased to approximately 32 gigahertz.

Where the implant of greatest dosage of concentration is approximately 1000 angstroms below the gate, and of a dosage concentration of $10^{15}$ cm$^{-3}$, the frequency response is raised to over 40 gigahertz, an increase of over 40% with regard to the uniform doped MESFET channel, as shown in Curve C.

It is also true that an improved frequency response can be realized for an implant energy larger than 240KeV.

It should be recognized that the devices shown in FIGS. 1 and 2 can also be made using multiple implants of a number greater than 2 without departing from the teaching of this invention, particularly that the implants of greater dosage be placed further from the gate than are the implants of lesser dosage.

What is claimed is:

1. A high frequency FET having a channel region with a given dosage concentration and wherein said channel region contains an implant, said implant having a first dosage concentration at a first distance from a gate of said FET and a second dosage concentration at a second distance from the gate and wherein said first distance is larger than said second distance and said first dosage concentration is larger than said second dosage concentration, and said second dosage concentration is larger than the given dosage concentration of said channel region, said implant contains first and second implants, said first implant corresponding to said first dosage concentration and said second implant corresponding to said second dosage concentration in which each of the first and second implants is spatially arranged in a predetermined manner relative to the other, said first implant has a dosage N1 and said second implant has a dosage N2 and wherein said first implant is substantially spaced from said gate a first distance $D_1$ and said second implant is spaced from said gate a distance $D_2$ and wherein the capacitance of said FET varies inversely with said first distance $D_1$ and wherein the transconductance of said FET varies proportionally to the concentration of the said first dosage.

* * * * *